United States Patent
Baney (10) Patent No.: US 7,061,957 B2
(45) Date of Patent: Jun. 13, 2006

(54) EXTERNAL CAVITY LASER HAVING A SET ATMOSPHERE

(75) Inventor: Douglas M. Baney, Los Altos, CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/162,752

(22) Filed: Jun. 4, 2002

(65) Prior Publication Data

US 2003/0223471 A1    Dec. 4, 2003

(51) Int. Cl.
*H01S 3/22* (2006.01)
(52) U.S. Cl. .............................. 372/55; 372/20; 372/92
(58) Field of Classification Search ................. 372/92, 372/97, 98, 99, 107, 93, 25, 55, 69, 27
See application file for complete search history.

(56) References Cited

U.S. PATENT DOCUMENTS

| | | | |
|---|---|---|---|
| 3,713,743 A * | 1/1973 | Simms ........................ 356/338 |
| 4,520,486 A * | 5/1985 | Lavarini ...................... 372/95 |
| 4,656,639 A * | 4/1987 | Suhre ........................... 372/83 |
| 6,028,310 A * | 2/2000 | Atkinson et al. ....... 250/339.13 |
| 6,075,252 A * | 6/2000 | Atkinson et al. ......... 250/559.4 |
| 6,090,977 A * | 7/2000 | Hefner et al. ............. 562/512.2 |
| 6,249,343 B1 * | 6/2001 | Wang et al. ............. 356/243.1 |
| 6,275,513 B1 | 8/2001 | Chang-Hasnain et al. |
| 6,285,701 B1 * | 9/2001 | Albrecht et al. ............... 372/57 |
| 6,298,080 B1 * | 10/2001 | Heist et al. .................... 372/99 |
| 6,738,410 B1 * | 5/2004 | Partlo et al. ................ 372/100 |

* cited by examiner

*Primary Examiner*—Minsun Oh Harvey
*Assistant Examiner*—Tuan Nguyen (57) ABSTRACT

An external cavity laser having a set atmosphere is disclosed. In an embodiment, the laser system includes a gain medium to emit light in response to an applied current, a wavelength selective reflector configured to resonate the light that is emitted from the gain medium, and a chamber containing a set atmosphere, the chamber being optically connected to the gain medium and the wavelength selective reflector such that the light that is emitted from the gain medium passes through the chamber.

21 Claims, 6 Drawing Sheets

EXTERNAL CAVITY LASER HAVING A SET ATMOSPHERE

FIELD OF THE INVENTION

The invention relates generally to the field of lasers, and more particularly to an external cavity laser.

BACKGROUND OF THE INVENTION

In wavelength division multiplexing (WDM), data is transmitted simultaneously over a single fiber on multiple carrier signals that have different center wavelengths. The number of carrier signals that can be carried on a single optical fiber is a function of the linewidth of each carrier signal and how accurately the center wavelength of each carrier signal can be controlled. To accommodate the increasing demand for optical communications bandwidth, the number of optical channels per fiber has increased substantially, resulting in smaller wavelength spacing between optical channels in dense wavelength division multiplexed (DWDM) systems.

Figure 1:
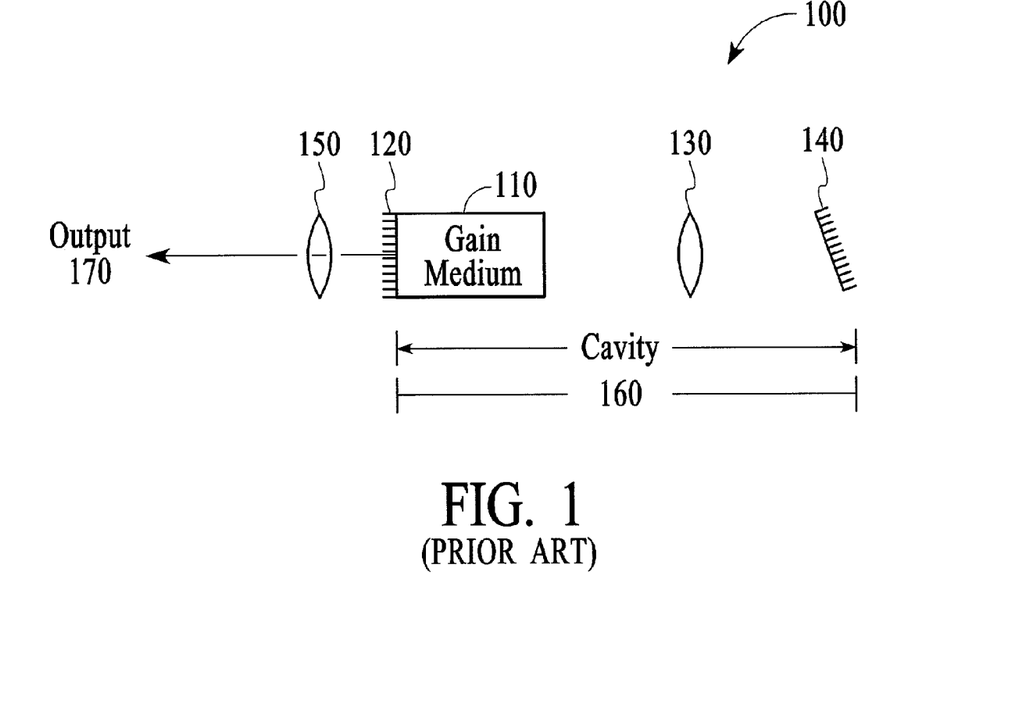
FIG. 1 depicts a prior art external cavity laser.

In order to keep multiple carrier signals from interfering with each other and to maximize the number of carrier signals that can be multiplexed into a fiber, it is necessary to accurately control the wavelength of the carrier signals that are output by a laser into an optical fiber. One type of laser that can be used to generate carrier signals in DWDM systems is an external cavity laser. FIG. 1 depicts an example of a prior art external cavity laser 100. The external cavity laser 100 includes an optical gain medium 110, a first lens 130, a diffraction grating 140, a partially reflective mirror 120, and a second lens 150. When activated, the external cavity laser 100 produces an optical output 170. In known external cavity lasers, the cavity between the gain medium 110 and the diffraction grating 140 is exposed to an uncontrolled atmosphere. Such an uncontrolled atmosphere may possess unwanted wavelength-dependent absorptive characteristics that reduce the performance of the laser. For example, an atmosphere of air includes water vapor that can absorb light in varying degrees resulting in output power changes at wavelengths that the water absorbs. Additionally, using known external cavity lasers, calibration of the output wavelength of the laser is difficult to achieve.

In view of the desire to multiplex more carrier signals into a single fiber, what is needed is an external cavity laser with a stable center wavelength and a simple and accurate technique for calibrating an external cavity laser.

SUMMARY OF THE INVENTION

A laser system includes a gain medium to emit light in response to an applied current, a wavelength selective reflector configured to resonate the light that is emitted from the gain medium, and a chamber containing a set atmosphere, the chamber being optically connected to the gain medium and the wavelength selective reflector such that the light that is emitted from the gain medium passes through the chamber.

In an embodiment, the chamber encapsulates the gain medium and the wavelength selective reflector. In this embodiment, the chamber may contain an inert atmosphere. An inert atmosphere may be utilized to reduce problems of unwanted spectral absorption that are characteristic of external cavity lasers operating in uncontrolled atmospheres.

In another embodiment, the chamber is located in an optical path of the resonated light. In this embodiment, the chamber may contain a wavelength selective atmosphere with known spectral features. For example, the atmosphere might be known to absorb light at a given wavelength or wavelengths. Such an atmosphere can be used to calibrate the laser system.

Other aspects and advantages of the present invention will become apparent from the following detailed description, taken in conjunction with the accompanying drawings, illustrating by way of example the principles of the invention.

DETAILED DESCRIPTION OF THE INVENTION

A set atmosphere external cavity laser for stability and calibration is disclosed. A laser system includes a gain medium to emit light in response to an applied current, a wavelength selective reflector configured to resonate the light that is emitted from the gain medium, and a chamber containing a set atmosphere, the chamber being optically connected to the gain medium and the wavelength selective reflector such that the light that is emitted from the gain medium passes through the chamber.

Figure 2:
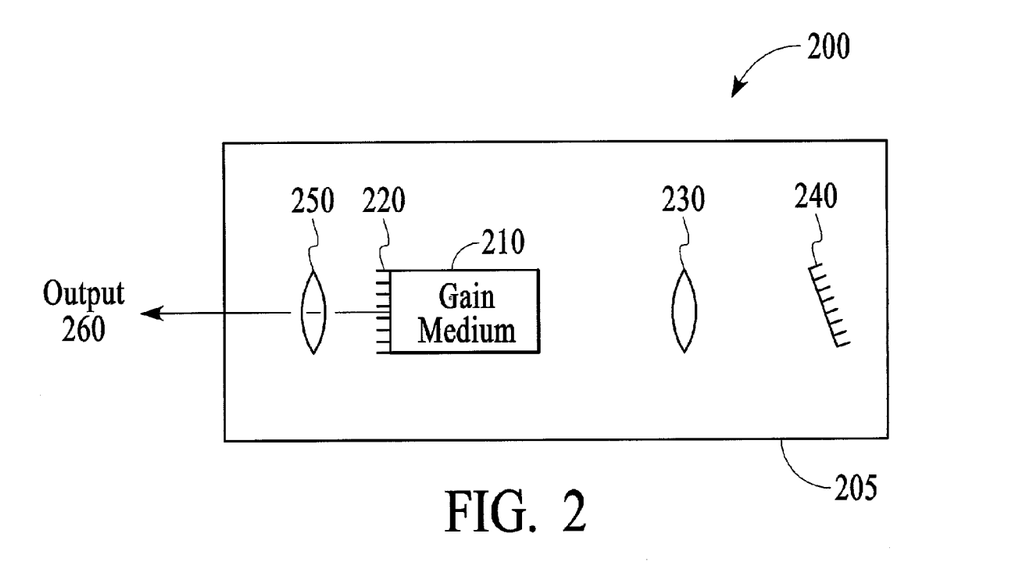
FIG. 2 depicts an embodiment of a laser system that is encapsulated in a chamber.

FIG. 2 depicts an embodiment of a laser system 200 that is encapsulated in a chamber 205. The laser system includes a gain medium 210, a first lens 230, a wavelength selective reflector 240, a partially reflective mirror 220 and a second lens 250. The gain medium 210 generates and emits light in response to an applied current. In one embodiment, the light emitted from the gain medium 210 passes through the first lens 230. The first lens 230 may serve to focus the light emitted from gain medium 210. The wavelength selective reflector 240 reflects light passing through the first lens 230 and causes the light to resonate at a selected wavelength between the partially reflective mirror 220 (first optical reflector) and the wavelength selective reflector 240 (second optical reflector). In the embodiment of FIG. 2, the wavelength selective reflector is a diffraction grating that can be rotated or adjusted to tune the laser system to different wavelengths. Although the wavelength selective reflector is described as a diffraction grating, it may be any other type of wavelength selective reflector. Examples of other wavelength selective reflectors include transmission gratings, mirrors on micro electromechanical systems (MEMS) actuators, distributed Bragg reflectors in bulk form. The partially reflective mirror 220 reflects light back towards the wavelength selective reflector 240 and a resonant wavelength is achieved. In one embodiment, the partially reflective mirror 220 allows light to pass through to the second lens 250 once resonance energy reaches a predefined intensity. Light which passes through the partially reflective mirror 220 is focused by the second lens 250 into a focused light output. More or fewer lenses than the first lens 230 and the second lens 250 may be used. Although a type of external cavity laser is described with reference to FIG. 2, other types of lasers are contemplated.

In the embodiment of FIG. 2, the chamber 205 encapsulates the gain medium 210, the wavelength selective reflector 240, the partially reflective mirror 220, the first lens 230 and the second lens 250. However, other configurations for the chamber 205 are contemplated. For example, in an embodiment, the chamber 205 does not contain the second lens 250. The chamber 205 may be gas-tight or airtight.

As described above, the chamber 205 contains a set atmosphere. A set atmosphere is a controlled atmosphere having known chemical and/or optical properties. Light emitted from the gain medium 210 passes through the set atmosphere that is contained within the chamber forming an optical connection between the chamber, the gain medium, and the wavelength selective reflector 240. In the embodiment of FIG. 2, the passage of light through the set atmosphere occurs directly after the light leaves the gain medium 210, during the resonation process, and after light is output from the laser cavity. In other embodiments, the light may pass through the set atmosphere by alternate paths.

In one embodiment, the set atmosphere is an inert atmosphere. An inert atmosphere is an atmosphere void of spectral features across a wavelength range of interest. An inert atmosphere may be an inert gas such as nitrogen or some other inert gas. Such an inert atmosphere may be useful to minimize fluctuations in the power and/or wavelength of the light output by the laser system by reducing the uncontrolled absorption of light by the surrounding atmosphere.

In another embodiment, the set atmosphere is a wavelength selective atmosphere. A wavelength selective atmosphere is an atmosphere with known spectral features across a wavelength range of interest. Examples of wavelength selective gases that may be used for the wavelength selective atmosphere are acetylene and hydrogen cyanide. Acetylene exhibits known absorption features that are uniformly spaced over the 1510 to 1545 nm range and hydrogen cyanide exhibits known absorption features that are uniformly spaced over the 1545 to 1560 nm range. Other wavelength selective gases are also contemplated. The specific gas choice is subject to compatibility with the chemical properties of elements that constitute the laser.

In an embodiment, the known spectral features of the wavelength selective atmosphere are utilized to calibrate an external cavity laser. For example, the spectral features of resonated light may be monitored and the output wavelength of the laser system may be calibrated based upon results of the monitoring. The calibration may, for example, entail measuring the output power as a function of wavelength, and, rotating the wavelength selective reflector 240 to alter the resonant wavelength in response to the measurement. Known spectral features typically include absorption characteristics, however other spectral features may exist.

Figure 3:
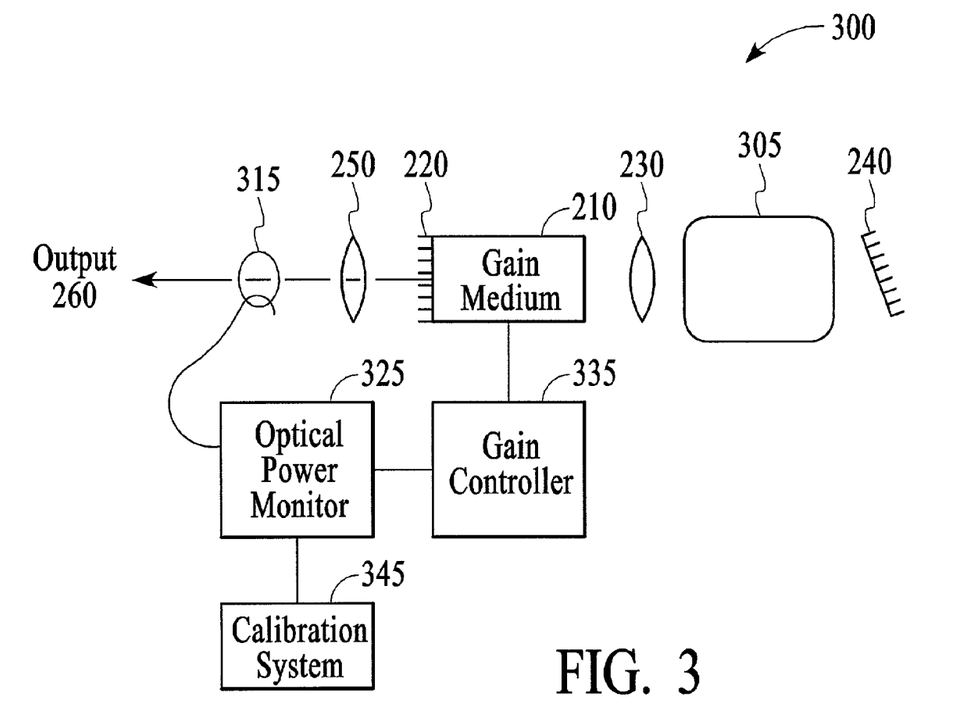
FIG. 3 depicts an embodiment of a laser system wherein a chamber is located in an optical path of resonated light.

FIG. 3 depicts an embodiment of a laser system 300 wherein a chamber 305 is located in an optical path between the gain medium 210 and the wavelength selective reflector 240 such that light emitted from the gain medium passes through the chamber. As depicted in FIG. 3, the chamber 305 may be located in an optical path between the first lens 230 and the wavelength selective reflector 240. The chamber 305, as with chamber 205, contains a set atmosphere as described above with reference to FIG. 2. Similarly, chambers 505, 705, and 905 described below, contain such set atmospheres. It is contemplated that chambers 205, 305, 505, 705 and 905 may differ in their location with respect to other elements of the system. It is also contemplated that chambers 205, 305, 505, 705 and 905 may serve similar or distinct functions with respect to one another.

The laser system 300 depicted in FIG. 3 may also include an optical tap 315, an optical power monitor 325, a gain controller 335, and a calibration system 345. In an embodiment, the optical tap 315 taps a portion of the light from the output beam 260. The optical tap 315 is optically connected to the optical power monitor 325. The optical power monitor 325 monitors the power of light being output by the laser system 300 based on the light it receives from the optical tap 315. The gain controller 335 is connected to the optical power monitor 325 and the gain medium 210. In an embodiment, the gain controller 335 controls the current that is applied to the gain medium 210 in response to monitoring results received from the optical power monitor 325. This may be implemented to minimize dips in optical power output that are caused by absorption within the set atmosphere. Additionally or alternatively, the calibration system 345 is connected to the optical power monitor 325. The calibration system 345 uses the monitoring results received from the optical power monitor 325 to calibrate the output wavelength of the laser system. In an embodiment, the calibration system 345 is used in conjunction with a set atmosphere having known spectral features across a wavelength range of interest such that a dip in the power level output by the laser is interpreted as light being emitted at a known wavelength. Using this information, the laser output wavelength can be calibrated. The optical power monitor 325, the gain controller 335 and the calibration system 345 may be included with any of the systems described with reference to FIGS. 2 and 4–10.

Figure 4:
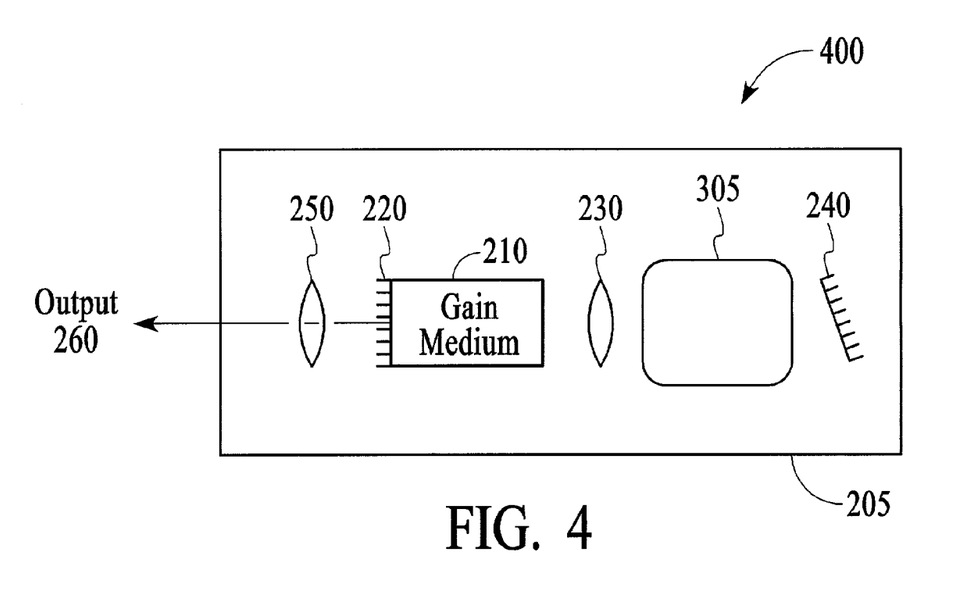
FIG. 4 depicts an embodiment of a laser system that includes a first chamber and a second chamber, the first chamber is located in an optical path of resonated light and the second chamber encapsulates a gain medium, a wavelength selective reflector and the first chamber.

FIG. 4 depicts an embodiment of a laser system 400 that includes a first chamber 305 and a second chamber 205. The first chamber 305 is located in an optical path of the resonated light and the second chamber 205 encapsulates the gain medium 210, the wavelength selective reflector 240 and the first chamber 305. The encapsulation of the gain medium 210, the wavelength selective reflector 240, and the first chamber 305 may also be termed encapsulation of the laser system. The first chamber 305 may contain a different type of set atmosphere than the second chamber 205. For example, the first chamber 305 may contain a wavelength selective atmosphere while the second chamber 205 may contain an inert atmosphere. The preceding is merely an example. Other set atmosphere combinations are also contemplated.

Figure 5:
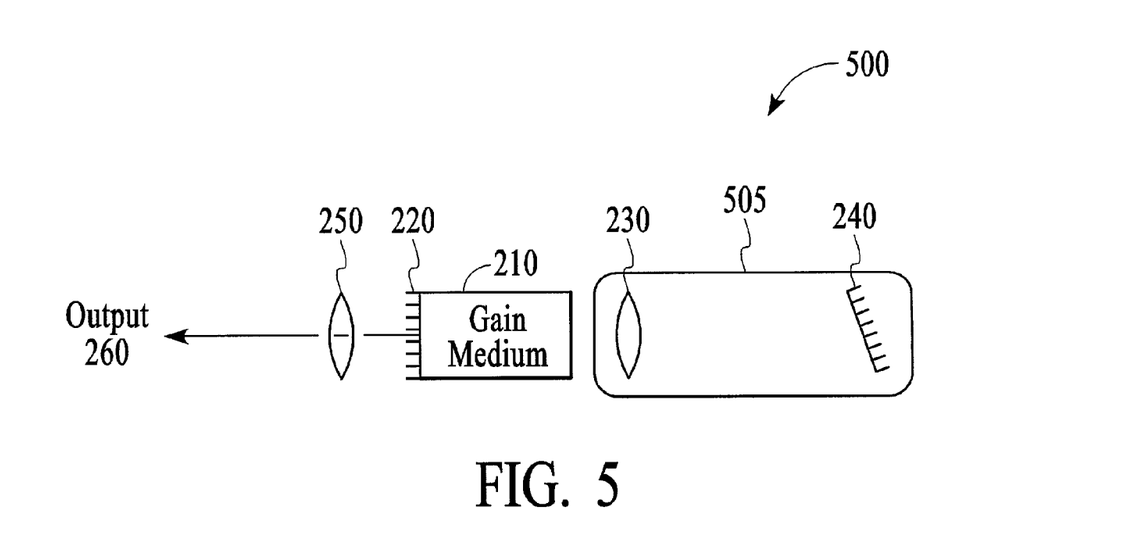
FIG. 5 depicts an embodiment of a laser system having a chamber that contains a first lens and a wavelength selective reflector.

FIG. 5 depicts an embodiment of a laser system 500 having a chamber 505 that contains the first lens 230 and the wavelength selective reflector 240. The chamber includes a set atmosphere that may be set to an inert or wavelength selective atmosphere.

Figure 6:
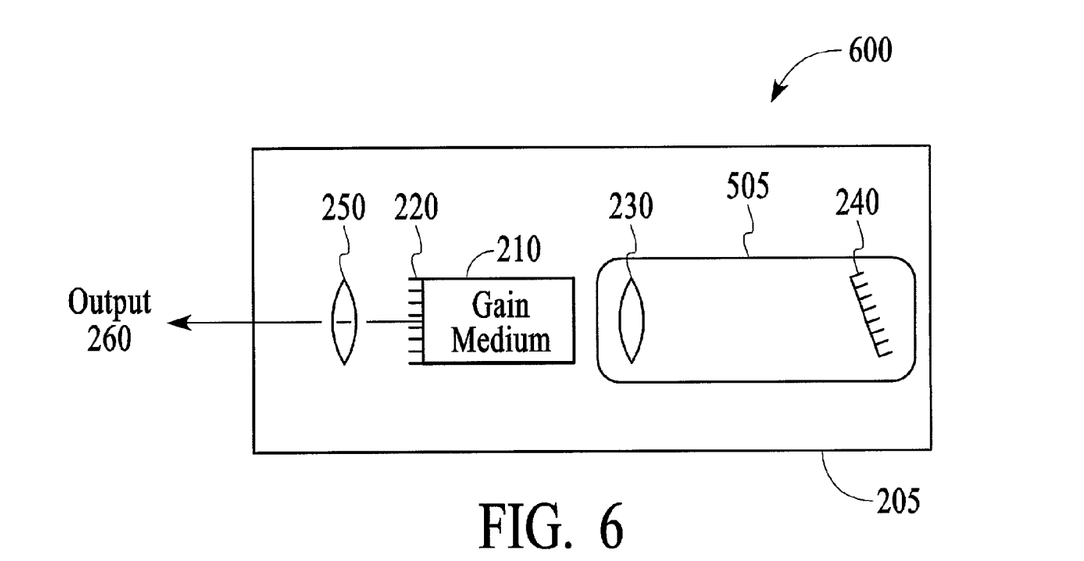
FIG. 6 depicts an embodiment of a laser system having a first chamber and a second chamber, the first chamber contains a first lens and a wavelength selective reflector, and the second chamber encapsulates the laser system.

FIG. 6 depicts an embodiment of a laser system 600 having a first chamber 505 and a second chamber 205. The first chamber 505 contains the first lens 230 and the wavelength selective reflector 240 and the second chamber 205 encapsulates the laser system 600. The second chamber 205 may contain less than all of the elements of the laser system 600. For example, the second chamber 205 may contain only the gain medium 210 and the first chamber 505. As with the relationship between the chamber 205 and the chamber 305 described above with reference to FIG. 4, the second chamber 205 and the first chamber 505 may contain different types of set atmospheres.

Figure 7:
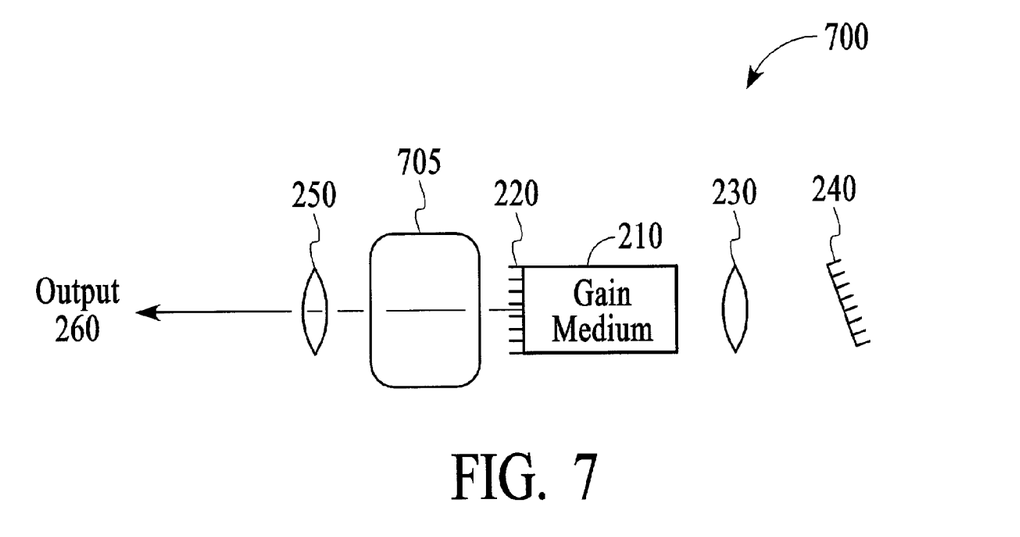
FIG. 7 depicts an embodiment of a laser system having a chamber that is located in an optical path that is outside of the laser cavity.

FIG. 7 depicts an embodiment of a laser system 700 having a chamber 705 that is located in an optical path between the partially reflective mirror 220 and the second lens 250. That is, the chamber is located in an optical path that is outside of the laser cavity. Locating the chamber 705 in an optical path that is outside of the laser cavity may reduce the impact upon optical output when compared to chambers that are located within the laser cavity. The chamber 705 contains a set atmosphere.

Figure 8:
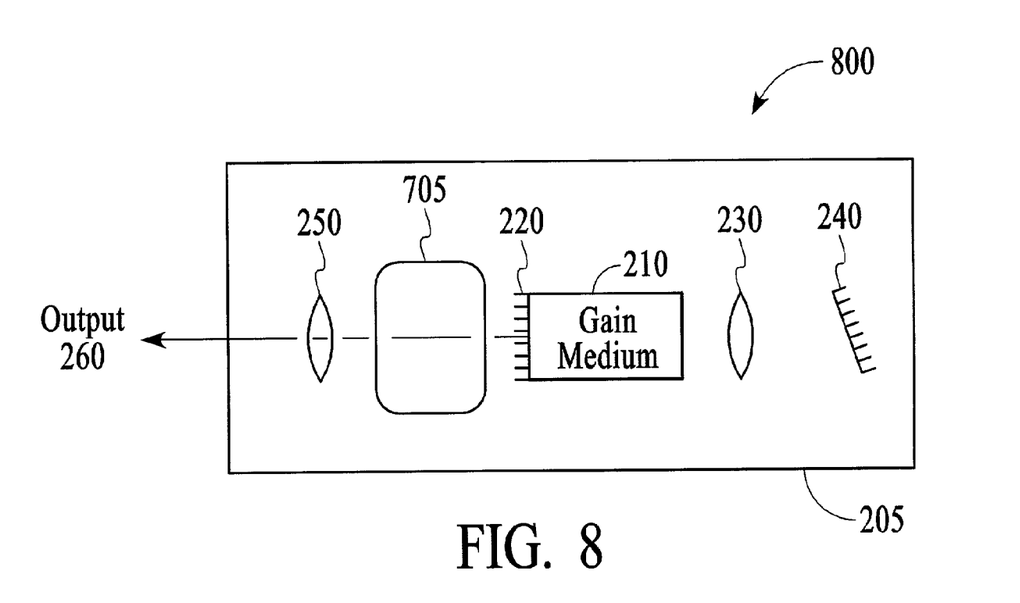
FIG. 8 depicts an embodiment of a laser system having a first chamber and a second chamber, the first chamber is located in an optical path that is outside of the laser cavity, and the second chamber encapsulates the laser system.

FIG. 8 depicts an embodiment of a laser system 800 having a first chamber 705 and a second chamber 205. The first chamber 705 is located in an optical path between the partially reflective mirror 220 and the second lens 250 and the second chamber 205 encapsulates the laser system 800. It is contemplated that the second chamber 205 may contain any combination of elements of the laser system 800. The second chamber 205 may contain a different set atmosphere than the chamber 705.

Figure 9:
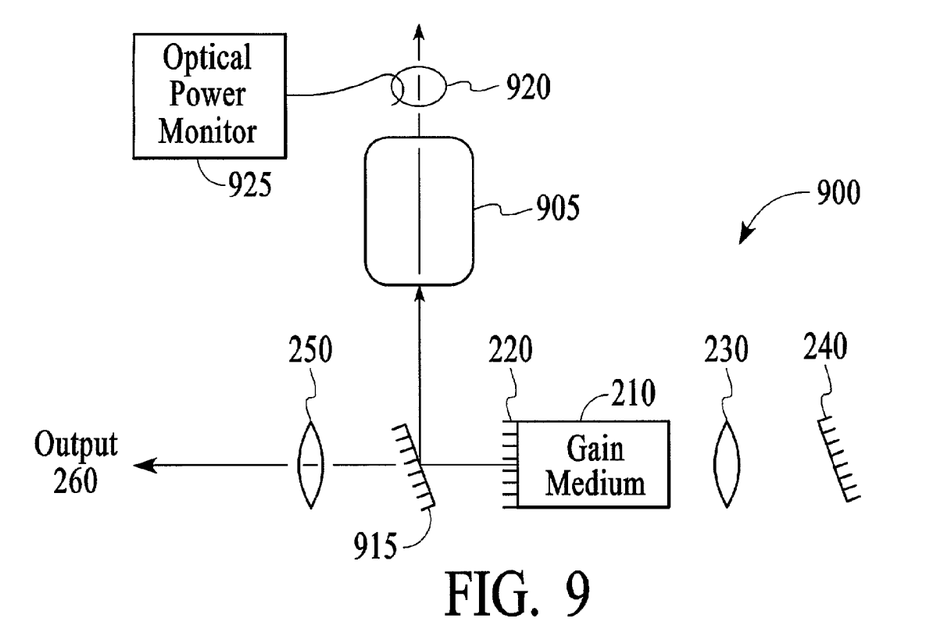
FIG. 9 depicts an embodiment of a laser system having a chamber that receives a portion of resonated light that is output through a first partially reflective mirror and reflected by a second partially reflective mirror.

FIG. 9 depicts an embodiment of a laser system 900 having a chamber 905 that receives a portion of resonated light that is output through the first partially reflective mirror 220 and reflected by a second partially reflective mirror 915. As depicted in FIG. 9, the chamber 905 is located outside of the normal path of resonated light. Other arrangements for providing a portion of the resonated light to the chamber are contemplated.

The laser system 900 may also include an optical tap 920 and an optical power monitor 925. The optical tap 920 taps a portion of the light being emitted from the chamber 905. The optical tap 920 is optically connected to the optical power monitor 925. The optical power monitor 925 receives the portion of light from the optical tap 920 and monitors spectral features of the resonated light by observing the power output. As is described above with reference to FIG. 3, the laser system 900 may also include a gain controller and a calibration system for controlling the current that is applied to the gain medium and for calibrating the output wavelength of the laser system.

Figure 10:
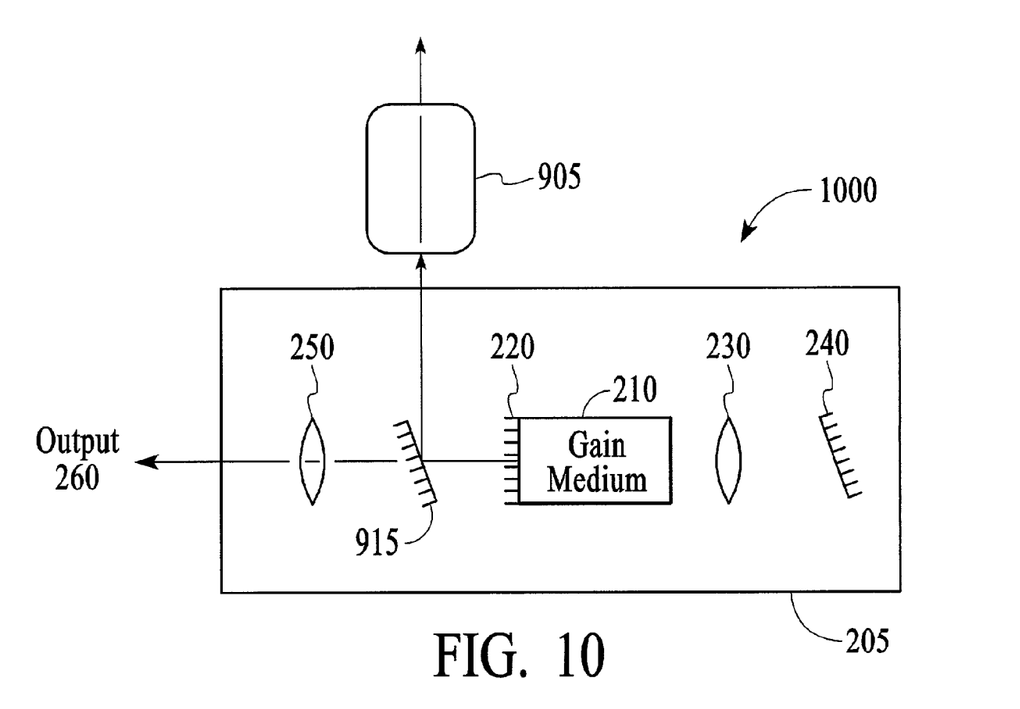
FIG. 10 depicts an embodiment of a laser system having a first chamber and a second chamber, the first chamber receives a portion of resonated light that is output through a first partially reflective mirror and reflected by a second partially reflective mirror, and the second chamber encapsulates the laser system.

FIG. 10 depicts an embodiment of a laser system 1000 having a first chamber 905 and a second chamber 205. The first chamber 905 receives a portion of the resonated light that is output through the first partially reflective mirror 220 and reflected by the second partially reflective mirror 915 and the second chamber 205 encapsulates the laser system 1000. In the embodiment of FIG. 10, the chamber 905 is located outside of the chamber 205. The first chamber 905 and the second chamber 205 may contain different set atmospheres.

Figure 11:
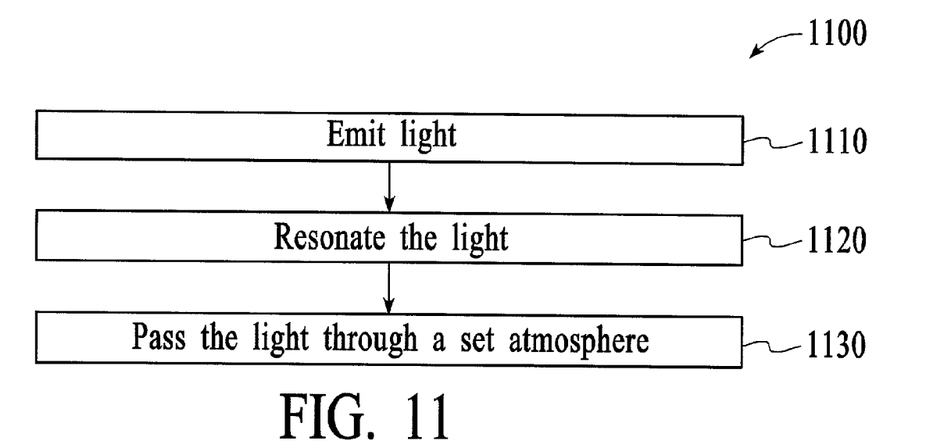
FIG. 11 is a flow diagram of one embodiment of a method of operation of the laser systems of FIG. 2–FIG. 10.

FIG. 11 is a flow diagram of one embodiment of a method of operation of the laser systems of FIG. 2–FIG. 10. At block 1110, light is emitted. At block 1120, the light is resonated. At block 1130, the light is passed through a set atmosphere. In one embodiment, the light is emitted from a gain medium. In another embodiment, the light is resonated within a cavity external to the gain medium. In an alternate embodiment, a portion of the resonated light is reflected into a chamber containing a set atmosphere.

Figure 12:
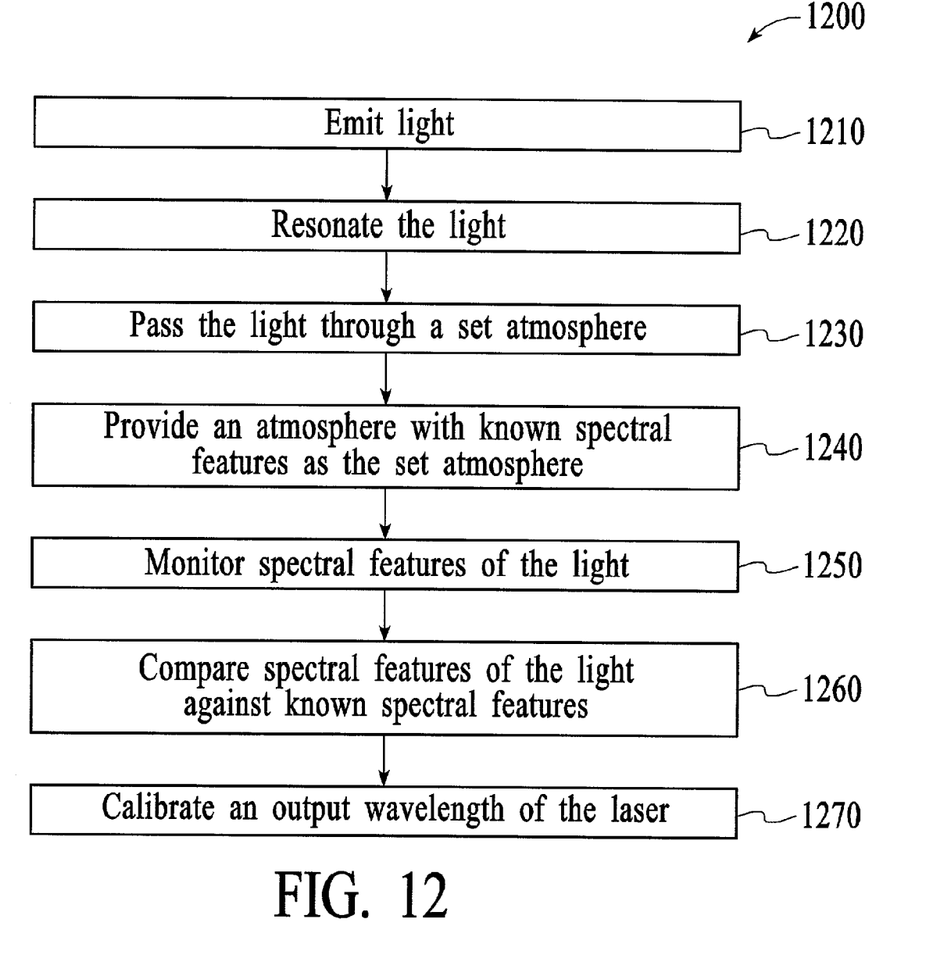
FIG. 12 is a flow diagram of another embodiment of a method of operation of the laser systems of FIG. 2–FIG. 10.

FIG. 12 is a flow diagram of another embodiment of a method of operation of the laser systems of FIG. 2–FIG. 10. At block 1210, light is emitted. At block 1220, the light is resonated. At block 1230, the light is passed through a set atmosphere. At block 1240, an atmosphere with known spectral features across a wavelength range of interest is provided as the set atmosphere. At block 1250, spectral features of the resonated light are monitored. At block 1260, the monitored spectral features of the resonated light are compared against the known spectral features of the set atmosphere. At block 1270, an output wavelength of the laser system is calibrated based upon results of this comparison. In an alternate embodiment, an atmosphere void of spectral features across a wavelength range of interest is provided as the set atmosphere to reduce problems associated with unwanted spectral absorption.

Although specific embodiments of the invention have been described and illustrated, the invention is not limited to the specific forms and arrangements of parts so described and illustrated. The invention is limited only by the claims.

What is claimed is:

1. A laser system comprising:
    a gain medium that emits light in response to an applied current;
    a wavelength selective reflector, in optical communication with said gain medium, configured to resonate said light that is emitted from said gain medium; and
    a chamber containing a set atmosphere, said chamber being optically coupled to said gain medium and said wavelength selective reflector such that said light that is emitted from said gain medium passes through said chamber, said set atmosphere having known optical properties, wherein said set atmosphere is a wavelength selective atmosphere;
    wherein said set atmosphere has known spectral features across a wavelength range of interest and further including:
    an optical power monitor, in optical communication with light that passes through said chamber, which measures optical power of said light; and
    a calibration system, in signal communication with said optical power monitor, which calibrates an output wavelength of said laser system in response to said optical power measurements.

2. The laser system of claim 1 wherein said chamber encapsulates said gain medium and said wavelength selective reflector.

3. The laser system of claim 2 wherein said set atmosphere is an inert atmosphere.

4. The laser system of claim 1 wherein said chamber is located in an optical path of said resonated light.

5. The laser system of claim 4 wherein said set atmosphere is a wavelength selective atmosphere.

6. The laser system of claim 5 wherein said set atmosphere is selected from the group consisting of acetylene and hydrogen cyanide.

7. The laser system of claim 4 further comprising a second chamber to encapsulate said gain medium, said wavelength selective reflector and said chamber.

8. The laser system of claim 7 wherein said second chamber encloses a second set atmosphere.

9. The laser system of claim 1 wherein said chamber is gas-tight.

10. The laser system of claim 1 wherein said set atmosphere comprises an inert atmosphere.

11. The laser system of claim 1 wherein said wavelength selective reflector comprises a diffraction grating.

12. The laser system of claim 12 further comprising a partially reflective mirror to reflect a portion of said resonated light into said chamber.

13. The laser system of claim 13 further comprising a monitor to monitor spectral features of said resonated light in said chamber.

14. A method of operating an external cavity laser comprising:
  emitting tight;
  resonating said light;
  passing said resonated light through a set atmosphere, said set atmosphere having known optical properties;
  providing an atmosphere with known spectral features across a wavelength range, of interest as said set atmosphere;
  monitoring spectral features of said resonated light;
  comparing the spectral features of said resonated light against the known spectral features of the set atmosphere; and
  calibrating all output wavelength of said laser based upon results of said comparing.

15. The method of claim 14 further comprising providing an atmosphere void of spectral features across a wavelength range of interest as said set atmosphere.

16. The method of claim 14 wherein said known spectral features comprise absorption characteristics.

17. A laser system comprising:
  a gain medium for emitting light;
  a plurality of optical reflectors, in optical communication with said gain medium, for resonating said light that is emitted from said gain medium;
  an enclosing means, in optical communication with said gain medium and said plurality of optical reflectors, for enclosing a set atmosphere through which said resonated light is to pass, said set atmosphere having known optical properties, a wherein said set atmosphere has known spectral features across a wavelength range of interest;
  an optical power monitor, in optical communication with said resonated light, which measures optical power of said resonated light; and
  a calibration system, in signal communication with said optical power monitor, which calibrates an output wavelength of said laser system in response to said optical power measurements.

18. The laser system of claim 17 wherein said enclosing means encapsulates said plurality of optical reflectors and said gain medium.

19. The laser system of claim 18 wherein said set atmosphere is void of spectral features across a wavelength range of interest.

20. The laser system of claim 17 wherein said enclosing means is located in an optical path of said resonated light.

21. The laser system of claim 17 wherein said set atmosphere has known spectral features across a wavelength: range of interest.

* * * * *

UNITED STATES PATENT AND TRADEMARK OFFICE
CERTIFICATE OF CORRECTION

PATENT NO. : 7,061,957 B2
APPLICATION NO. : 10/162752
DATED : June 13, 2006
INVENTOR(S) : Baney It is certified that error appears in the above-identified patent and that said Letters Patent is hereby corrected as shown below:

In column 7, line 15, in Claim 12, delete "claim 12" and insert -- claim 1 --, therefor.

In column 7, line 18, in Claim 13, delete "claim 13" and insert -- claim 12 --, therefor.

In column 7, line 23, in Claim 14, delete "tight" and insert -- light --, therefor.

In column 7, line 28, in Claim 14, after "range" delete ",".

In column 7, line 34, in Claim 14, delete "all" and insert -- an --, therefor.

In column 8, line 13, in Claim 17, delete "a" before "wherein".

In column 8, line 35, in Claim 21, after "wavelength" delete ":".

Signed and Sealed this

Twenty-first Day of November, 2006

JON W. DUDAS
*Director of the United States Patent and Trademark Office*